(12) United States Patent
Song et al.

(10) Patent No.: US 8,362,539 B2
(45) Date of Patent: Jan. 29, 2013

(54) SEMICONDUCTOR DEVICE AND SEMICONDUCTOR PACKAGE INCLUDING THE SAME

(75) Inventors: Ki-Whan Song, Yongin-si (KR); Jung-Bae Lee, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 783 days.

(21) Appl. No.: 12/458,874

(22) Filed: Jul. 27, 2009

(65) Prior Publication Data

US 2010/0018760 A1  Jan. 28, 2010

(30) Foreign Application Priority Data

Jul. 28, 2008 (KR) .................. 10-2008-0073664

(51) Int. Cl.
*H01L 27/108* (2006.01)
(52) U.S. Cl. ................ 257/299; 257/E27.014
(58) Field of Classification Search ............ 257/213, 257/288, 296, 299, 901, E27.014; 365/185.27
See application file for complete search history.

(56) References Cited

U.S. PATENT DOCUMENTS 6,355,950 B1   3/2002  Livengood et al.
2005/0128812 A1* 6/2005 Cai et al. ............ 365/185.18

FOREIGN PATENT DOCUMENTS

| JP | 56087380 A | * | 7/1981 |
| JP | 4-103128 | | 4/1992 |
| JP | 4-360570 | | 12/1992 |
| KR | 10-2005-0093216 | | 9/2005 |

* cited by examiner

*Primary Examiner* — Brook Kebede
(74) *Attorney, Agent, or Firm* — Harness, Dickey & Pierce, P.L.C

(57) ABSTRACT

A semiconductor device includes a first substrate including at least one first well region and first impurity regions on portions of the substrate and a bias voltage plate on a surface of the substrate. A semiconductor device may be of a three dimensional stack structure, and in example embodiments, the semiconductor device may further include a through contact plug substantially perpendicularly penetrating at least one substrate and at least one bias voltage plate. Therefore, a design margin of a semiconductor device may be enhanced and a bias voltage may be provided reliably.

20 Claims, 9 Drawing Sheets

SEMICONDUCTOR DEVICE AND SEMICONDUCTOR PACKAGE INCLUDING THE SAME

PRIORITY STATEMENT

This application claims priority under 35 USC §119 to Korean Patent Application No. 2008-0073664, filed on Jul. 28, 2008, in the Korean Intellectual Property Office (KIPO), the entire contents of which are herein incorporated by reference.

BACKGROUND

1. Technical Field

Example embodiments relate to a semiconductor, and more particularly to a semiconductor device that enhances a design margin of wiring and reliably provides a substrate voltage and/or a well bias voltage, and a semiconductor package including the semiconductor device.

2. Description of the Related Art

As a degree of integration in a semiconductor device increases, a gap between wires for inputting and/or outputting a voltage signal or a current signal decreases. As the wiring gap decreases, providing power reliably and transmitting a signal correctly becomes more difficult, thereby a performance of a system is degraded. As such, the smaller wiring gap becomes a limitation in increasing a degree of integration in a semiconductor device.

SUMMARY

Example embodiments provide a semiconductor device which has an improved layout and wiring by efficiently providing a substrate and well bias voltage. Example embodiments provide a semiconductor device of a three dimensional stack structure and a semiconductor package which enhance a design margin of wiring and provide a bias voltage reliably.

According to example embodiments, a semiconductor device may include a first substrate and a first bias voltage plate. The first substrate may include at least one first well region and first impurity regions formed on portions of the first substrate. The first bias voltage plate may be formed on a surface of the first substrate.

At least one well bias voltage may be applied to the at least one first well region through a contact plug connecting a wire on the first substrate to a surface of the at least one first well region, and a back bias voltage may be applied to the first bias voltage plate. The first bias voltage plate may include a plurality of segments that are patterned to separate regions of the plurality of segments receiving bias voltages different from each other.

At least one first well bias voltage may be applied to the at least one first well region through a contact plug connecting a wire on the first substrate to a surface of the at least one first well region, and at least one second well bias voltage may be applied to the plurality of segments of the first bias voltage plate.

According to example embodiments, a semiconductor device may further include a second substrate and a second bias voltage plate. The second substrate may be on the first substrate, and the second substrate may include at least one second well region and second impurity regions on portions of the second substrate. The second bias voltage plate may be formed on a surface of the second substrate.

The semiconductor device may further include at least one through contact plug penetrating the first bias voltage plate and the first substrate to contact the second bias voltage plate on the surface of the second substrate. At least one of the first bias voltage plate and the second bias voltage plate may include a plurality of segments that are patterned to separate regions of the plurality of segments receiving bias voltages different from each other.

The first substrate and the second substrate may be stacked such that both a surface of the first substrate and a surface of the second substrate face the same direction, thereby forming a face-to-bottom stack structure. The semiconductor device may further include at least one through contact plug penetrating the first bias voltage plate and the first substrate to contact the second bias voltage plate on the surface of the second substrate.

At least one well bias voltage may be applied to the at least one first well region or to the at least one second well region through a contact plug connecting a wire on the first substrate and the second substrate to a surface of the at least one first well region or to a surface of the at least one second well region, and a back bias voltage may be applied to the first bias voltage plate and, simultaneously, to the second bias voltage plate through the at least one through contact plug.

The first bias voltage plate and the second bias voltage plate may include a plurality of segments that are patterned to separate regions of the plurality of segments receiving bias voltages different from each other. The semiconductor device may further include a plurality of through contact plugs penetrating the plurality of segments of the first bias voltage plate and the first substrate to contact the plurality of segments of the second bias voltage plate on the surface of the second substrate, respectively.

Well bias voltages, different from each other, may be applied to the plurality of segments of the first bias voltage plate and, simultaneously, to the plurality of segments of the second bias voltage plate through the plurality of through contact plugs.

The first substrate and the second substrate may be stacked such that a surface of the first substrate faces the opposite direction of a surface of the second substrate, thereby forming a bottom-to-bottom stack structure. The semiconductor device may further include at least one through contact plug penetrating the first substrate and the first bias voltage plate to contact the second bias voltage plate on the surface of the second substrate.

A back bias voltage may be applied to the first bias voltage plate and to the second bias voltage plate, simultaneously, through the at least one through contact plug. The first bias voltage plate and the second bias voltage plate may include a plurality of segments that are patterned to separate regions of the plurality of segments receiving bias voltages different from each other.

The semiconductor device may further include at least one first through contact plug penetrating the first substrate and the plurality of segments of the first bias voltage plate to contact the plurality of segments of the second bias voltage plate on the surface of the second substrate, wherein at least one first well bias voltage may be applied to the plurality of segments of the first bias voltage plate and to the plurality of segments of the second bias voltage plate, simultaneously, through the at least one first through contact plug.

The semiconductor device may further include at least one second through contact plug penetrating the second substrate and the plurality of segments of the second bias voltage plate to contact the plurality of segments of the first bias voltage plate on the surface of the first substrate, wherein at least one second well bias voltage may be applied to the plurality of segments of the second bias voltage plate and to the plurality of segments of the first bias voltage plate, simultaneously, through the at least one second through contact plug.

According to example embodiments, a semiconductor package may include a printed circuit board and the semiconductor device of example embodiments. The semiconductor device may be on the printed circuit board.

BRIEF DESCRIPTION OF THE DRAWINGS

Illustrative, non-limiting example embodiments will be more clearly understood from the following detailed description in conjunction with the accompanying drawings.

DETAILED DESCRIPTION OF EXAMPLE EMBODIMENTS

Figure 1:
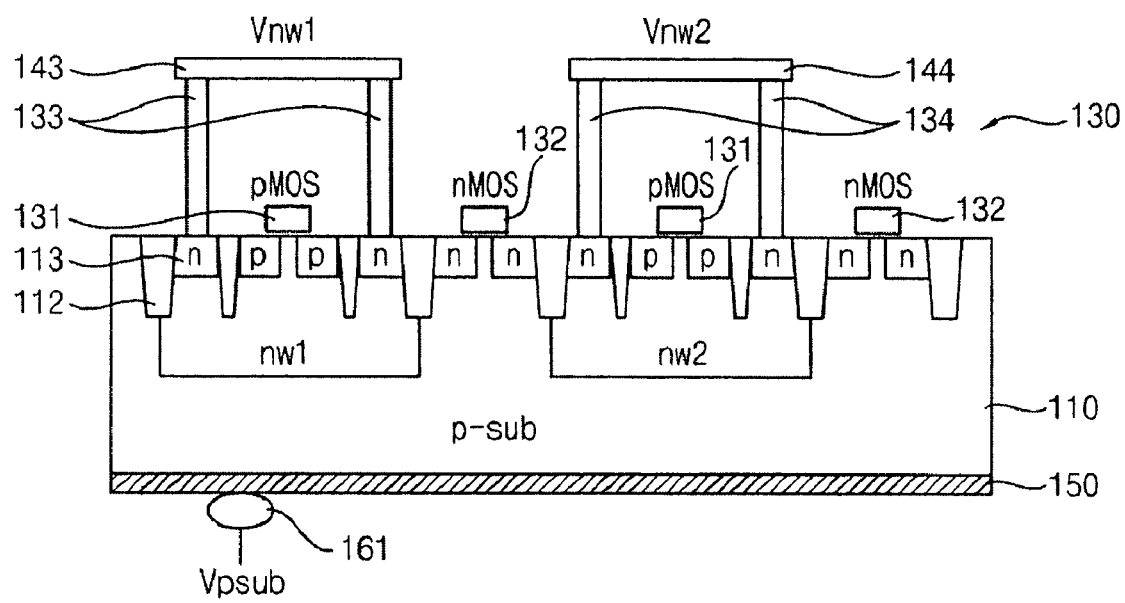
FIG. 1 is a diagram illustrating a semiconductor device including a bias voltage plate according to example embodiments.

Various example embodiments will be described more fully with reference to the accompanying drawings, in which some example embodiments are shown. The present invention may, however, be embodied in many different forms and should not be construed as limited to example embodiments set forth herein. Rather, these embodiments are provided so that this disclosure will be thorough and complete, and will fully convey the scope of the present invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a semiconductor device including a bias voltage plate according to example embodiments. Referring to FIG. 1, a semiconductor device 100 may include a semiconductor substrate 110 and a bias voltage plate 150.

One or more well regions nw1 and nw2 and impurity regions n and p may be formed on portions of the substrate 110 as illustrated in FIG. 1, e.g., upper portions, and the bias voltage plate 150 may be formed on a surface of the substrate 110, e.g., a bottom surface. The bias voltage plate 150 may be formed using a conductive material having a relatively low resistance. The conductive material may include a metal, e.g., copper (Cu), gold (Au), tungsten (W) and titanium (Ti), or the conductive material may include a nitride of the metal, a polysilicon doped with impurities and a metal silicide.

One or more well bias voltages Vnw1 and Vnw2 may be applied to the well regions nw1 and nw2 from above the semiconductor device 100 through one or more contact plugs 133 and 134. The contact plugs 133 and 134 may be formed substantially vertically to connect one or more wires 143 and 144, which are formed on the substrate 110, to a surface of the well regions nw1 and nw2. The contact plugs 133 and 134 may contact an impurity region 113 formed in the well regions nw1 and nw2. A back bias voltage or a substrate voltage Vpsub may be applied to the bias voltage plate 150 from below the semiconductor device 100. For example, the back bias voltage Vpsub may be applied to the bias voltage plate 150 from outside through a conductive bump 161 using a surface contact between the conductive bump 161 and the bias voltage plate 150.

Various types of semiconductor elements may be formed on the substrate 100. For example, the semiconductor elements may include p-type metal oxide semiconductor (pMOS) transistors and n-type metal oxide semiconductor (nMOS) transistors formed on the substrate 110 as illustrated in FIG. 1. The substrate 100 may be formed using a single-crystalline semiconductor material. For example, the substrate 110 may be formed using a silicon single crystal. An active region and element separation region may be defined by forming separation walls 112. The separation walls 112 may be formed by forming trenches on a portion of the substrate 110 and filling the trenches with insulation materials. For example, the separation walls 112 may be formed by a local oxidation of silicon (LOCOS) process or a shallow trench isolation (STI) process. P-type metal oxide semiconductor (PMOS) transistors may be formed by doping a p-type impurity into the n-type well regions nw1 and nw2 to form the impurity regions p, and forming first gate electrodes 131 on the substrate 110 between the impurity regions p. N-type metal oxide semiconductor (nMOS) transistors may be formed by doping an n-type impurity into the p-type substrate 110 to form the impurity regions n, and forming second gate electrodes 132 on the substrate 110 between the impurity regions n.

Although FIG. 1 illustrates the semiconductor device 100 including a CMOS transistor of a twin-well structure in which an n-type well is formed on a p-type semiconductor substrate, when an nMOS transistor requiring a different bias voltage is required, the semiconductor device 100 may adopt a triple-well structure in which a deep n-type well is formed, and a p-type well may be formed in the deep n-type well. Alternatively, a p-type well may be formed on an n-type semiconductor substrate. Semiconductor elements formed on a semiconductor substrate are not limited to a CMOS transistor, but various types of semiconductor elements may be formed on the semiconductor substrate in accordance with a circuit integrated in the semiconductor substrate. FIG. 1 illustrates only the wires 143 and 144 for applying the bias voltages, the contact plugs 133 and 134 connecting the wires 143 and 144 to the well regions nw1 and nw2, and the first and second gate electrodes 131 and 132 as an example of a structure 130 formed on the substrate 100, but the structure 130 is not limited to the wires 143 and 144, the contact plugs 133 and 134, and the gate electrodes 131 and 132. The structure 130 formed on the substrate 100 may include passive elements, e.g., a capacitor and a resistor. In FIG. 1, contact plugs connected to a gate electrode, a source region or a drain region of a transistor, and wires for an input/output signal are omitted to facilitate a description.

Figure 2:
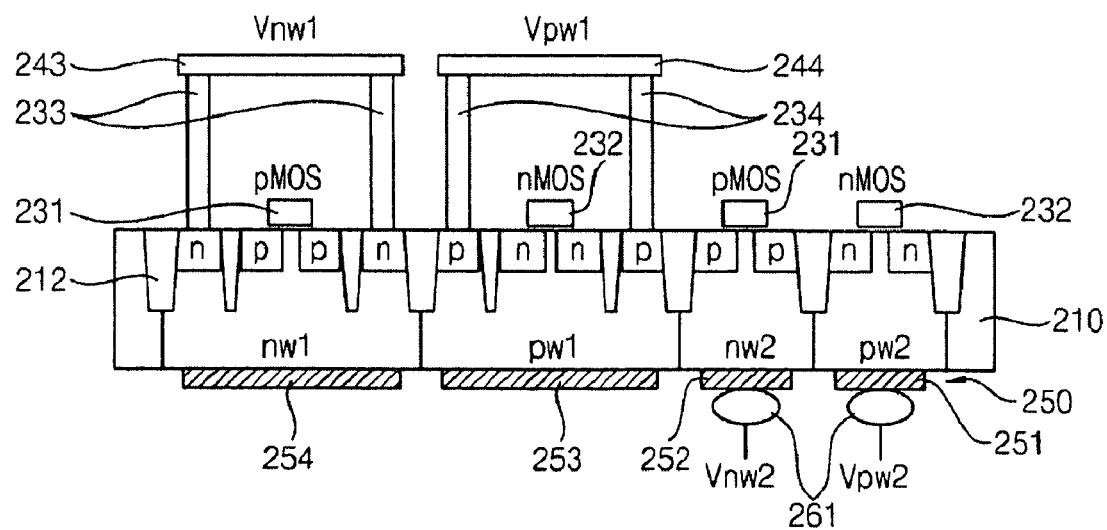
FIG. 2 is a diagram illustrating a semiconductor device including a patterned bias voltage plate according to example embodiments.

FIG. 2 is a diagram illustrating a semiconductor device including a patterned bias voltage plate according to example embodiments. Referring to FIG. 2, a semiconductor device 200 may include a semiconductor substrate 210 and a patterned bias voltage plate 250. One or more well regions nw1, pw1, nw2 and pw2, and impurity regions n and p may be formed on portions of the substrate 210 as illustrated in FIG. 2, e.g., upper portions, and the patterned bias voltage plate 250 may be formed on a surface of the substrate 210, e.g., bottom surface.

The patterned bias voltage plate 250 may include a plurality of segments 254, 253, 252 and 251 that are patterned to separate regions receiving bias voltages Vnw1, Vpw1, Vnw2 and Vpw2 different from each other.

One or more first well bias voltages Vnw1 and Vpw1 may be applied to the well regions nw1 and pw1 from above the semiconductor device 200 through one or more contact plugs 233 and 234. The contact plugs 233 and 234 may be formed substantially vertically to connect one or more wires 243 and 244, which are formed on the substrate 210, to a surface of the well regions nw1 and pw1. One or more second well bias voltages Vnw2 and Vpw2 may be applied to the segments 252 and 251 of the patterned bias voltage plate 250 from below the semiconductor device 200 through conductive bumps 261 using a surface contact between the conductive bumps 261 and the segments 252 and 251. An active region and element separation region may be defined by forming separation walls 212. The separation walls 212 may be formed by forming trenches on a portion of the substrate 210 and filling the trenches with insulation materials. For example, the separation walls 212 may be formed by a local oxidation of silicon (LOCOS) process or a shallow trench isolation (STI) process. P-type metal oxide semiconductor (pMOS) transistors may be formed by doping a p-type impurity into the n-type well regions nw1 and nw2 to form the impurity regions p, and forming first gate electrodes 231 on the substrate 210 between the impurity regions p. N-type metal oxide semiconductor (nMOS) transistors may be formed by doping an n-type impurity into the p-type substrate 210 to form the impurity regions n, and forming second gate electrodes 232 on the substrate 210 between the impurity regions n. Structures of the semiconductor devices in accordance with example embodiments described with FIGS. 1 and 2 may be adopted to a semiconductor device of a three dimensional stack structure that will be described below in which at least two substrates are stacked.

Figure 3:
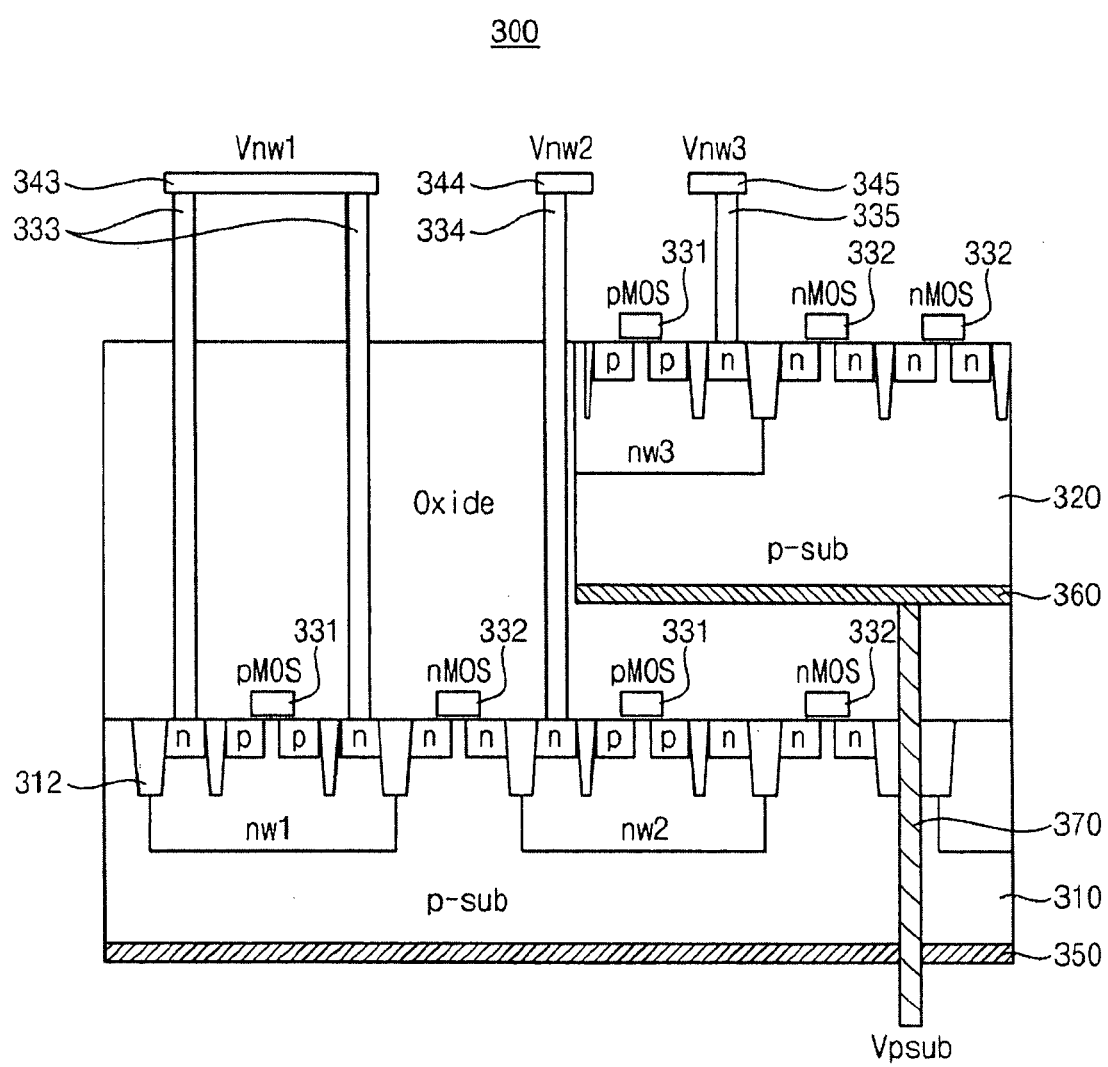
FIG. 3 is a diagram illustrating a semiconductor device of a face-to-bottom structure including a bias voltage plate according to example embodiments.

FIG. 3 is a diagram illustrating a semiconductor device of a face-to-bottom structure including a bias voltage plate according to example embodiments. Referring to FIG. 3, a semiconductor device 300 may include a first substrate 310, a first bias voltage plate 350, a second substrate 320 and a second bias voltage plate 360.

One or more first well regions nw1 and nw2 and first impurity regions n and p may be formed on portions of the first substrate 310 as illustrated in FIG. 3, e.g., upper portions, and the first bias voltage plate 350 may be formed on a surface of the first substrate 310, e.g., bottom surface.

The second substrate 320 may be stacked on the first substrate 310. At least one second well region nw3 and second impurity regions n and p may be formed on portions of the second substrate 320 as illustrated in FIG. 3, e.g., upper portions, and the second bias voltage plate 360 may be formed on a surface of the second substrate 320, e.g., bottom surface.

The semiconductor device 300 may further include at least one through contact plug 370. The through contact plug 370 may be formed to substantially perpendicularly penetrate the first bias voltage plate 350 and the first substrate 310 to contact the second bias voltage plate 360 formed on the surface of the second substrate 320. The through contact plug 370, as well as the first and second bias voltage plates 350 and 360, may be formed using a conductive material having a relatively low resistance. The conductive material may include a metal, e.g., copper (Cu), gold (Au), tungsten (W) and titanium (Ti), or the conductive material may include a nitride of the metal, a polysilicon doped with impurities and a metal silicide.

In example embodiments, as illustrated in FIG. 2, at least one of the first bias voltage plate 350 and the second bias voltage plate 360 may include a plurality of segments that are patterned to separate regions of the plurality of segments receiving bias voltages different from each other and will be described below with FIG. 4. An active region and element separation region may be defined by forming separation walls 312. The separation walls 312 may be formed by forming trenches on a portion of the first and second substrates 310 and 320 and filling the trenches with insulation materials. For example, the separation walls 312 may be formed by a local oxidation of silicon (LOCOS) process or a shallow trench isolation (STI) process. P-type metal oxide semiconductor (PMOS) transistors may be formed by doping a p-type impurity into the n-type well regions nw1, nw2 and nw3 to form the impurity regions p, and forming first gate electrodes 331 on the first and second substrates 310 and 320 between the impurity regions p. N-type metal oxide semiconductor (nMOS)

transistors may be formed by doping an n-type impurity into the p-type first and second substrates 310 and 320 to form the impurity regions n, and forming second gate electrodes 332 on the first and second substrates 310 and 320 between the impurity regions n.

FIG. 3 illustrates a face-to-bottom stack structure in which the two substrates 310 and 320 are stacked such that both a surface of the first substrate 310 and a surface of the second substrate 320 face in the same direction of the semiconductor device 300.

One or more well bias voltages Vnw1, Vnw2 and Vnw3 may be applied to the first well regions nw1 and nw2 formed on the first substrate 310 or to the second well region nw3 formed on the second substrate 320 from above the semiconductor device 300 through one or more contact plugs 333, 334 and 335. The contact plugs 333, 334 and 335 may be formed substantially vertically to connect one or more wires 343, 344 and 345, which are formed on the first substrate 310 and the second substrate 320, to a surface of the first well regions nw1 and nw2 formed on the first substrate 310 or to a surface of the second well region nw3 formed on the second substrate 320. A back bias voltage Vpsub may be applied to the first bias voltage plate 350 from below the semiconductor device 300 and, simultaneously, to the second bias voltage plate 360 through the through contact plug 370.

Although FIG. 3 illustrates a stack structure in which two substrates are stacked, more than three substrates may be stacked. In example embodiments, a through contact plug may be formed to extend from below the semiconductor device to contact a bias voltage plate formed on a surface of an uppermost substrate.

Figure 4:
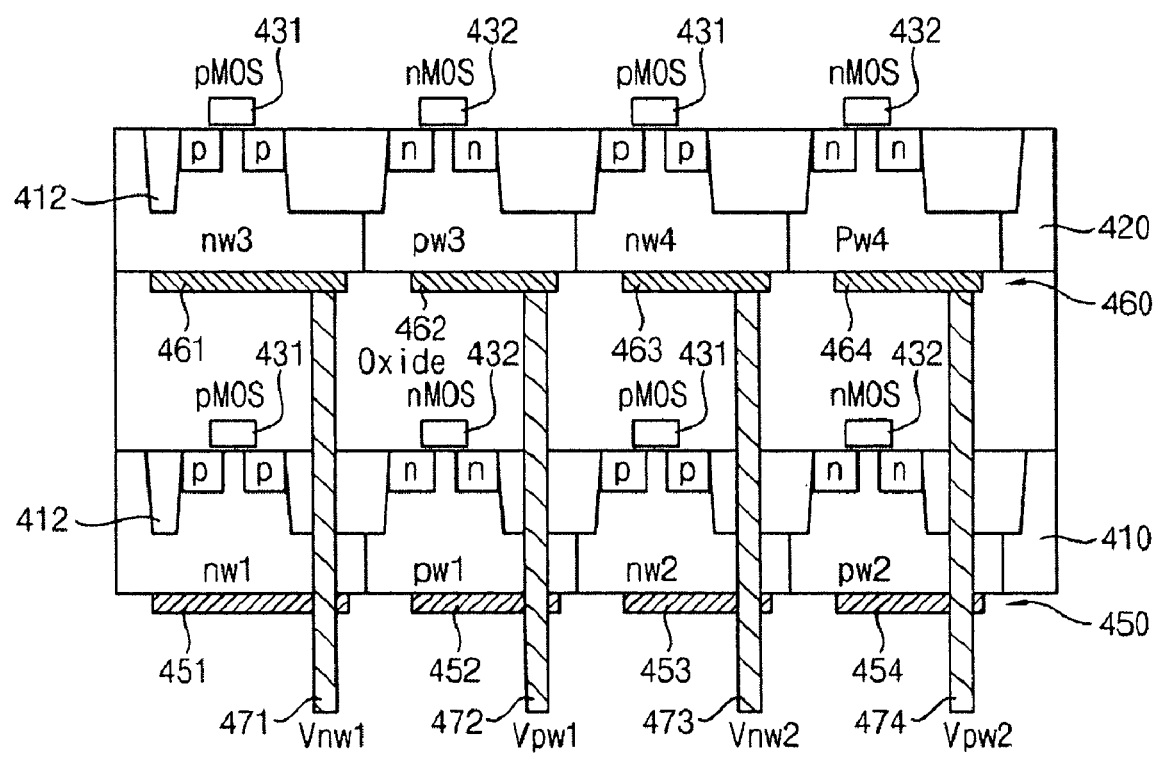
FIG. 4 is a diagram illustrating a semiconductor device of a face-to-bottom structure including a patterned bias voltage plate according to example embodiments.

FIG. 4 is a diagram illustrating a semiconductor device of a face-to-bottom structure including a patterned bias voltage plate according to example embodiments. Referring to FIG. 4, a semiconductor device 400 may include a first substrate 410, a first patterned bias voltage plate 450, a second substrate 420 and a second patterned bias voltage plate 460. One or more first well regions nw1, pw1, nw2 and pw2, and first impurity regions n and p may be formed on portions of the first substrate 410 as illustrated in FIG. 4, e.g., upper portions, and the first patterned bias voltage plate 450 may be formed on a surface of the first substrate 410, e.g., bottom surface.

The second substrate 420 may be stacked on the first substrate 410. One or more second well regions nw3, pw3, nw4 and pw4 and second impurity regions n and p may be formed on portions of the second substrate 420 and the second patterned bias voltage plate 460 may be formed on a surface of the second substrate 420.

FIG. 4 illustrates a face-to-bottom stack structure in which the two substrates 410 and 420 are stacked such that both a surface of the first substrate 410 and a surface of the second substrate 420 face upward or in the same direction of the semiconductor device 400.

As illustrated in FIG. 4, the first patterned bias voltage plate 450 may include a plurality of segments 451, 452, 453 and 454 that are patterned to separate regions receiving bias voltages different from each other. The second patterned bias voltage plate 460 may include a plurality of segments 461, 462, 463 and 464 that are patterned to separate regions receiving bias voltages different from each other.

The semiconductor device 400 may further include a plurality of through contact plugs 471, 472, 473 and 474. The plurality of through contact plugs 471, 472, 473 and 474 may be formed to substantially perpendicularly penetrate the segments 451, 452, 453 and 454 of the first patterned bias voltage plate 450 and the first substrate 410 to contact the segments 461, 462, 463 and 464 of the patterned second bias voltage plate 460 formed on the surface of the second substrate 420, respectively.

A plurality of well bias voltages Vnw1, Vpw1, Vnw2 and Vpw2, different from each other, may be applied to the segments 451, 452, 453 and 454 of the first patterned bias voltage plate 450 from below the semiconductor device 400 and, simultaneously, to the segments 461, 462, 463 and 464 of the second patterned bias voltage plate 460 through the through contact plugs 471, 472, 473 and 474, respectively.

An active region and element separation region may be defined by forming separation walls 412. The separation walls 412 may be formed by forming trenches on a portion of the first and second substrates 410 and 420 and filling the trenches with insulation materials. For example, the separation walls 412 may be formed by a local oxidation of silicon (LOCOS) process or a shallow trench isolation (STI) process. P-type metal oxide semiconductor (PMOS) transistors may be formed by doping a p-type impurity into the n-type well regions nw1, nw2, nw3 and nw4 to form the impurity regions p, and forming first gate electrodes 431 on the first and second substrates 410 and 420 between the impurity regions p. N-type metal oxide semiconductor (nMOS) transistors may be formed by doping an n-type impurity into the p-type first and second substrates 410 and 420 to form the impurity regions n, and forming second gate electrodes 432 on the first and second substrates 410 and 420 between the impurity regions n.

Figure 5:
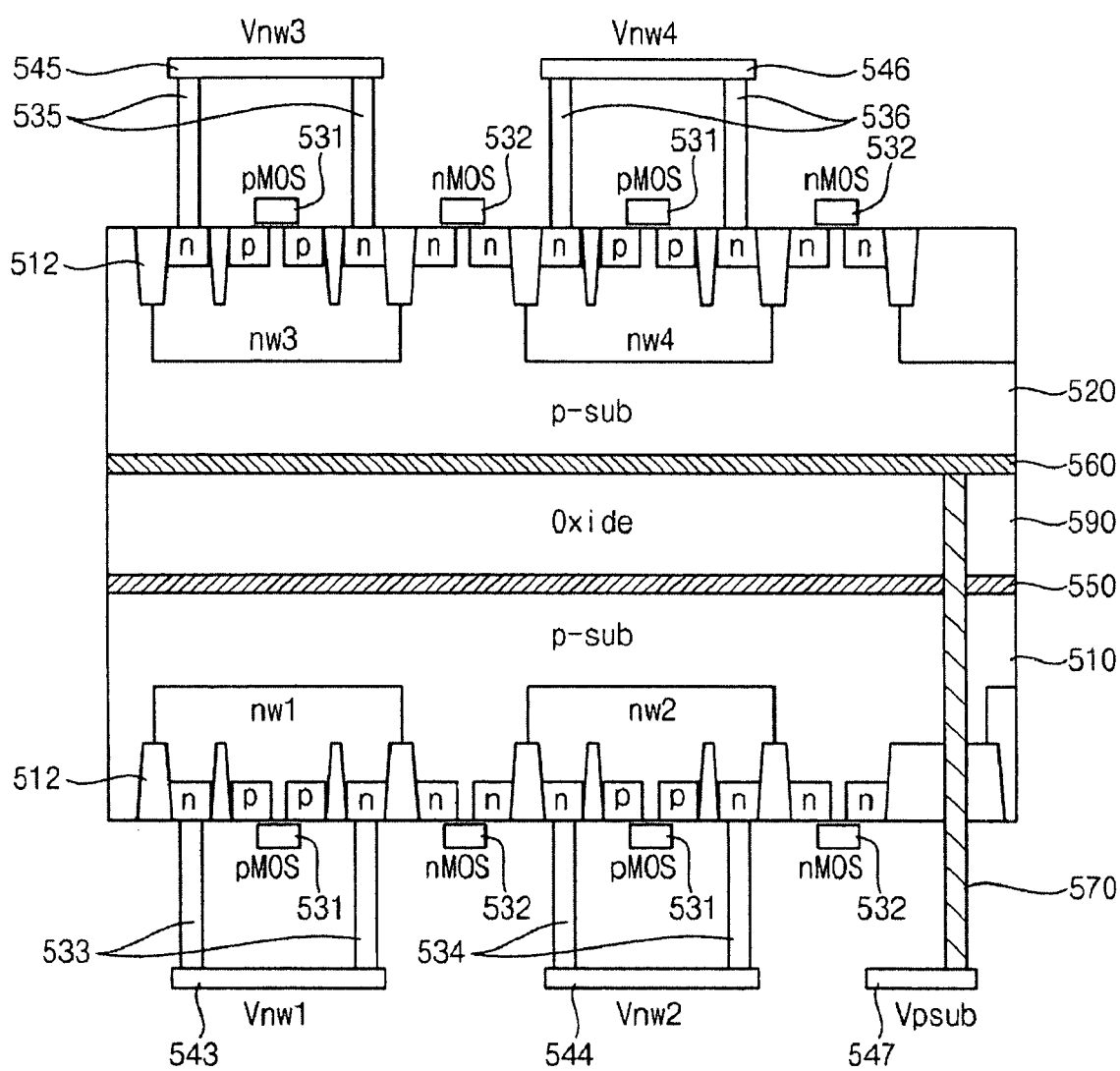
FIG. 5 is a diagram illustrating a semiconductor device of a bottom-to-bottom structure including a bias voltage plate according to example embodiments.

FIG. 5 is a diagram illustrating a semiconductor device of a bottom-to-bottom structure including a bias voltage plate according to example embodiments. Referring to FIG. 5, a semiconductor device 500 may include a first substrate 510, a first bias voltage plate 550, a second substrate 520 and a second bias voltage plate 560. One or more first well regions nw1 and nw2 and first impurity regions n and p may be formed on portions of the first substrate 510 as illustrated in FIG. 5, e.g., upper portions, and the first bias voltage plate 550 may be formed on a surface of the first substrate 510, e.g., bottom surface.

The second substrate 520 may be stacked on the first substrate 510. One or more second well regions nw3 and nw4, and second impurity regions n and p may be formed on portions of the second substrate 520 as illustrated in FIG. 5, e.g., upper portions, and the second bias voltage plate 560 may be formed on a surface of the second substrate 520, e.g., bottom surface.

FIG. 5 illustrates a bottom-to-bottom stack structure in which the two substrates 510 and 520 are stacked such that a surface of the first substrate 510 faces the opposite direction of a surface of the second substrate 520 of the semiconductor device 500. An oxide layer 590 may be included between the two bias voltage plates 550 and 560 for adhesion. A semiconductor device of the bottom-to-bottom stack structure may be formed by accumulating an oxide on the two bias voltage plates 550 and 560, and carrying out a bonding process with a relatively high temperature.

As illustrated in FIG. 5, the semiconductor device 500 may further include at least one through contact plug 570. The through contact plug 570 may be formed to substantially perpendicularly penetrate the first substrate 510 and the first bias voltage plate 550 to contact the second bias voltage plate 560 formed on the surface of the second substrate 520.

One or more well bias voltages Vnw1, Vnw2, Vnw3 and Vnw4 may be applied to the first well regions nw1 and nw2 formed on the first substrate 510 or to the second well regions nw3 and nw4 formed on the second substrate 520 from above the semiconductor device 500 through one or more contact plugs 533, 534, 535 and 536. The contact plugs 533, 534, 535 and 536 and the through contact plug 570 may be formed substantially vertically to connect one or more wires 543, 544, 545, 546 and 547, which are formed on the first substrate 510 and the second substrate 520, to a surface of the first well regions nw1 and nw2 formed on the first substrate 510 or to a surface of the second well regions nw3 and nw4 formed on the second substrate 520. A back bias voltage Vpsub may be applied to the first bias voltage plate 550 and to the second bias voltage plate 560, simultaneously, from below the semiconductor device 500 through the through contact plug 570.

An active region and element separation region may be defined by forming separation walls 512. The separation walls 512 may be formed by forming trenches at a portion of the first and second substrates 510 and 520 and filling the trenches with insulation materials. For example, the separation walls 512 may be formed by a local oxidation of silicon (LOCOS) process or a shallow trench isolation (STI) process. P-type metal oxide semiconductor (pMOS) transistors may be formed by doping a p-type impurity into the n-type well regions nw1, nw2, nw3 and nw4 to form the impurity regions p, and forming first gate electrodes 531 on the first and second substrates 510 and 520 between the impurity regions p. N-type metal oxide semiconductor (nMOS) transistors may be formed by doping an n-type impurity into the p-type first and second substrates 510 and 520 to form the impurity regions n, and forming second gate electrodes 532 on the first and second substrates 510 and 520 between the impurity regions n.

Figure 6:
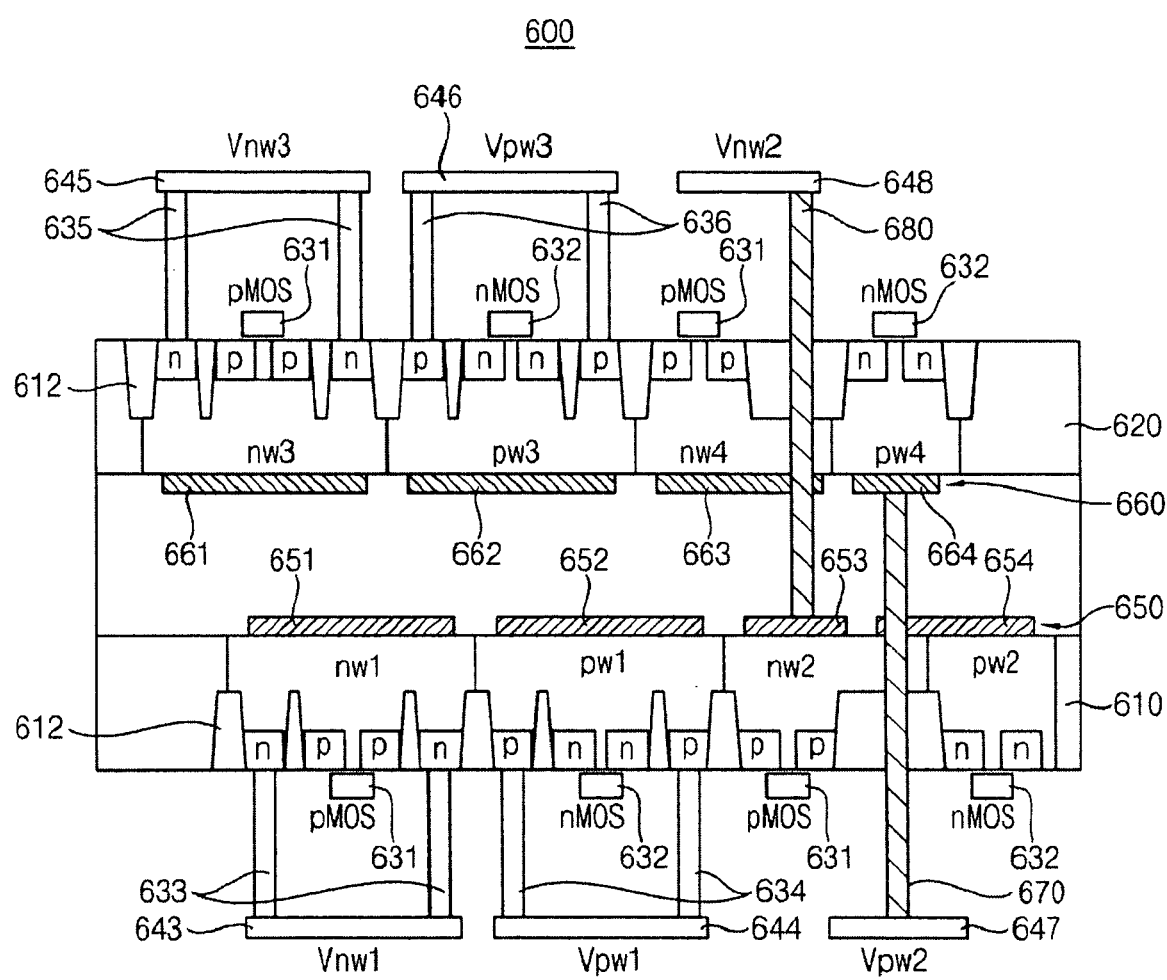
FIG. 6 is a diagram illustrating a semiconductor device of a bottom-to-bottom structure including a patterned bias voltage plate according to example embodiments.

FIG. 6 is a diagram illustrating a semiconductor device of a bottom-to-bottom structure including a patterned bias voltage plate according to example embodiments. Referring to FIG. 6, a semiconductor device 600 may include a first substrate 610, a first patterned bias voltage plate 650, a second substrate 620 and a second patterned bias voltage plate 660.

One or more first well regions nw1, pw1, nw2 and pw2, and first impurity regions n and p may be formed on portions of the first substrate 610 as illustrated in FIG. 6, e.g., upper portions, and the first patterned bias voltage plate 650 may be formed on a surface of the first substrate 610, e.g., bottom surface.

The second substrate 620 may be stacked on the first substrate 610. One or more second well regions nw3, pw3, nw4 and pw4, and second impurity regions n and p may be formed on portions of the second substrate 620 as illustrated in FIG. 6, e.g., upper portions, and the second patterned bias voltage plate 660 may be formed on a surface of the second substrate 620, e.g., bottom surface.

FIG. 6 illustrates a bottom-to-bottom stack structure in which the two substrates 610 and 620 are stacked such that a surface of the first substrate 610 faces in the opposite direction of a surface of the second substrate 620 of the semiconductor device 600.

As illustrated in FIG. 6, the first patterned bias voltage plate 650 may include a plurality of segments 651, 652, 653 and 654 that are patterned to separate regions receiving bias voltages different from each other. The second patterned bias voltage plate 660 may include a plurality of segments 661, 662, 663 and 664 that are patterned to separate regions receiving bias voltages different from each other.

The semiconductor device 600 may further include at least one first through contact plug 670. The first through contact plug 670 may be formed to substantially perpendicularly penetrate the first substrate 610 and the segment 654 of the first bias voltage plate 650 to contact the segment 664 of the second bias voltage plate 660 formed on the surface of the second substrate 620. In example embodiments, at least one first well bias voltage Vpw2 may be applied to the segment 654 of the first bias voltage plate 650 and to the segment 664 of the second bias voltage plate 660, simultaneously, from below the semiconductor device 600 through the first through contact plug 670.

The semiconductor device 600 may further include at least one second through contact plug 680. The second through contact plug 680 may be formed to substantially perpendicularly penetrate the second substrate 620 and the segment 663 of the second bias voltage plate 660 to contact the segment 653 of the first bias voltage plate 650 formed on the surface of the first substrate 610. In example embodiments, at least one second well bias voltage Vnw2 may be applied to the segment 663 of the second bias voltage plate 660 and to the segment 653 of the first bias voltage plate 650, simultaneously, from above the semiconductor device 600 through the second through contact plug 680.

One or more well bias voltages Vnw1, Vnw3, Vpw1 and Vpw3 may be applied to the first well regions nw1 and pw1 formed on the first substrate 610 or to the second well regions nw3 and pw3 formed on the second substrate 620 from above the semiconductor device 600 through one or more contact plugs 633, 634, 635 and 636. The contact plugs 633, 634, 635 and 636 and the through contact plugs 670 and 680 may be formed substantially vertically to connect one or more wires 643, 644, 645, 646, 647 and 648, which are formed on the first substrate 610 and the second substrate 620, to a surface of the first well regions nw1 and pw1 formed on the first substrate 610 or to a surface of the second well regions nw3 and pw3 formed on the second substrate 620.

An active region and element separation region may be defined by forming separation walls 612. The separation walls 612 may be formed by forming trenches on a portion of the first and second substrates 610 and 620 and filling the trenches with insulation materials. For example, the separation walls 612 may be formed by a local oxidation of silicon (LOCOS) process or a shallow trench isolation (STI) process. P-type metal oxide semiconductor (PMOS) transistors may be formed by doping a p-type impurity into the n-type well regions nw1, nw2, nw3 and nw4 to form the impurity regions p, and forming first gate electrodes 631 on the first and second substrates 610 and 620 between the impurity regions p. N-type metal oxide semiconductor (nMOS) transistors may be formed by doping an n-type impurity into the p-type well regions pw1, pw2, pw3 and pw4 to form the impurity regions n, and forming second gate electrodes 632 on the first and second substrates 610 and 620 between the impurity regions n.

Figure 7A:
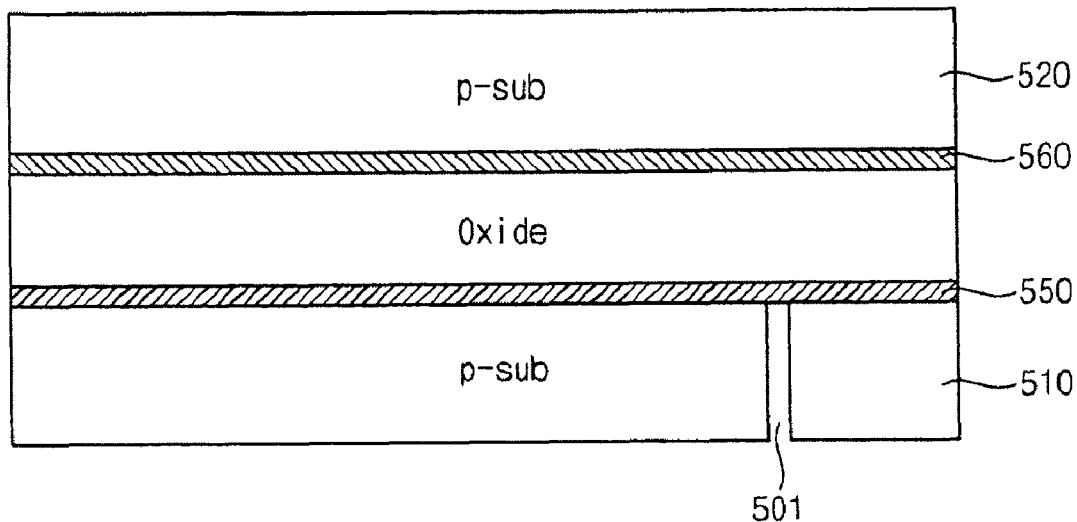
FIGS. 7A to 7D are diagrams illustrating a process of forming a through contact plug of a semiconductor device according to example embodiments.

FIGS. 7A to 7D are diagrams illustrating a process of forming a through contact plug of a semiconductor device according to example embodiments. The process of forming the through contact plug 570 of FIG. 5 will be described with reference to FIGS. 7A to 7D. FIG. 7A illustrates a first etching hole 501 formed to substantially perpendicularly penetrate the first substrate 510 by a first etching process. A photoresist pattern (not shown), selectively exposing a portion at which the through contact plug 570 will be formed, may be formed on an oxide insulation layer covering the surface of the first substrate 510. The second bias voltage plate 560 may be formed on the oxide layer, and the second substrate 520 may be formed on the second bias voltage plate 560. The photoresist pattern may be formed to have an opening which exposes the portion on which the through contact plug 570 will be formed. The first etching hole 501 may be formed by the first etching process which etches a portion of the insulation layer and the first substrate 510 exposed by the opening. When the first bias voltage plate 550 formed on the surface of the first substrate 510 may include a material having a higher selectivity ratio than a selectivity ratio of a material of the first substrate 510, e.g., tungsten or titanium nitride, the first etching process may be easily carried out because the first bias voltage plate 550 may serve as an etch stop layer.

Figure 7B:
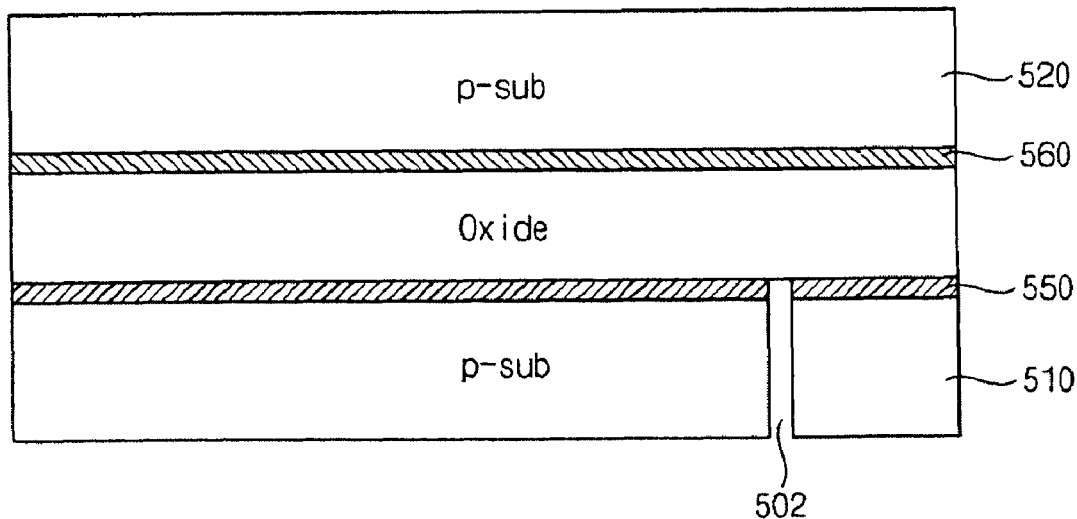

FIG. 7B illustrates a second etching hole 502 formed to substantially perpendicularly penetrate the first substrate 510 and the first bias voltage plate 550 by a second etching process which etches a portion of the first bias voltage plate 550 exposed by the first etching hole 501. For example, the second etching process may include a metal etching process.

Figure 7C:
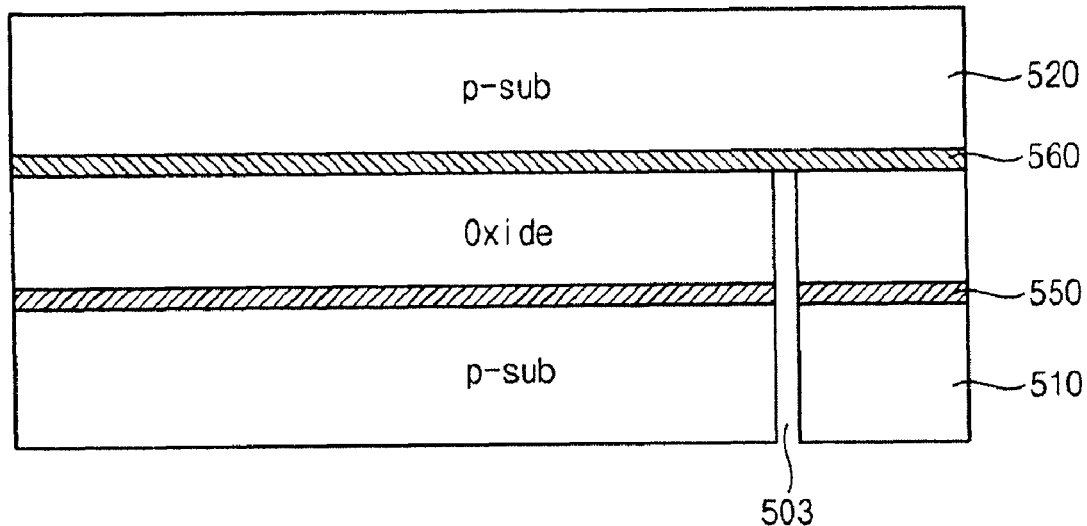

FIG. 7C illustrates a third etching hole 503 formed to substantially perpendicularly penetrate the first substrate 510, the first bias voltage plate 550 and an adhesion layer to expose a portion of the second bias voltage plate 560 by a third etching process which etches a portion of the adhesion layer exposed by the second etching hole 502. As described above, the third etching process may be easily carried out because the second bias voltage plate 560 serves as an etch stop layer.

Figure 7D:
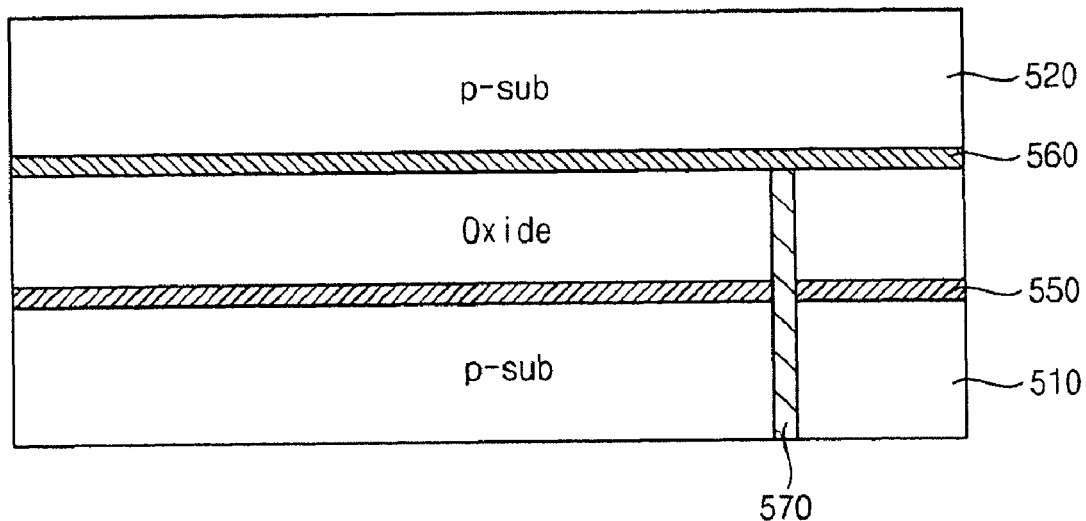

FIG. 7D illustrates the through contact plug 570 formed by filling the third etching hole 503 with a conductive material. The conductive material may include a metal, e.g., copper (Cu), gold (Au), tungsten (W) and titanium (Ti), or the conductive material may include a nitride of the metal, a polysilicon doped with impurities and a metal silicide. A barrier layer may be formed on an inner surface of the third etching hole 503 before the third etching hole 503 is filled with the conductive material. The barrier layer may prevent or reduce the conductive material filled in the through contact plug 570 from diffusing to the insulation layer to improve an electrical characteristic of the through contact plug 570. The barrier layer may include a titanium layer, a titanium nitride layer and/or a titanium/tungsten layer.

As described above, the through contact plug 570 may be formed by etching processes. The steps of etching processes may be easily carried out because the bias voltage plates 550 and 560 serve as an etch stop layer to lower a required accuracy of the etching processes.

Figure 8:
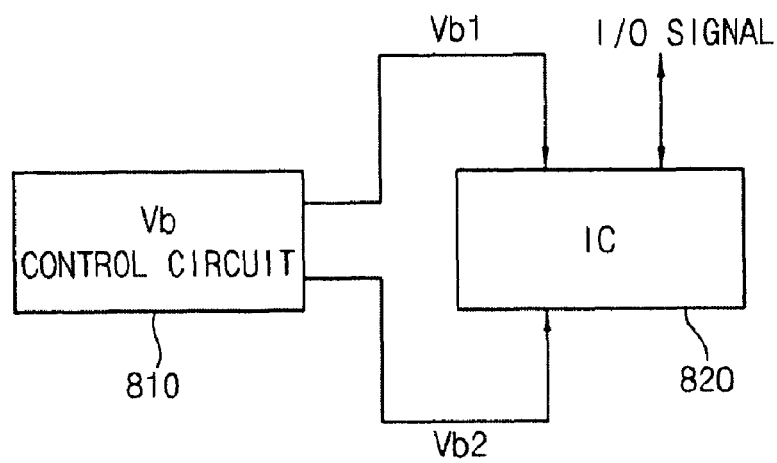
FIG. 8 is a diagram for describing paths of providing bias voltages to a semiconductor device according to example embodiments.

FIG. 8 is a diagram 800 for describing paths of providing bias voltages to a semiconductor device according to example embodiments. An integrated circuit 820 of FIG. 8 may be formed using the semiconductor devices in accordance with example embodiments described with reference to FIGS. 1 to 7. The integrated circuit 820 including various elements, e.g., a logic element and a memory element, may require bias voltages Vb1 and Vb2 different from each other. The bias voltages Vb1 and Vb2 provided by a bias voltage control circuit 810 may be ported to the integrated circuit 820 from above the integrated circuit 820 and/or from below the integrated circuit 820 to enhance a design margin of complex wiring formed on a semiconductor substrate. Some bias voltage Vb2 among the bias voltages Vb1 and Vb2 may be ported to the integrated circuit 820 in a direction different from a direction in which an input/output signal I/O SIGNAL is ported, thereby reducing an interference noise in the input/output signal I/O SIGNAL.

Figure 9:
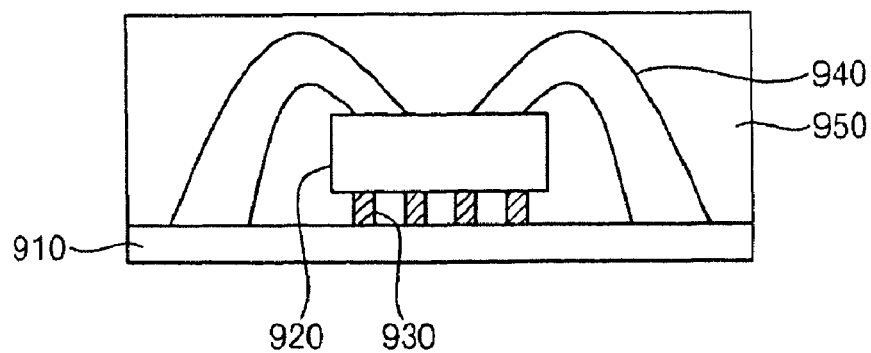
FIG. 9 is a diagram illustrating a semiconductor package according to example embodiments.

FIG. 9 is a diagram illustrating a semiconductor package 900 according to example embodiments. Referring to FIG. 9, a semiconductor package 900 may include a printed circuit board (PCB) 910 and a semiconductor device 920. The semiconductor device 920 may be mounted on the printed circuit board (PCB) 910. The semiconductor device 920 may include a substrate having one or more well regions and impurity regions on portions of the substrate, and a bias voltage plate formed on a surface of the substrate. The semiconductor device 920 may be formed using the semiconductor devices in accordance with example embodiments described with reference to FIGS. 1 to 7. The semiconductor device 920 may be electrically connected to the printed circuit board (PCB) 910 by a conductive bump 930, e.g., a solder ball and/or by a wire 940, and may be shielded by a molding 950. For example, the bias voltage plate included in the semiconductor devices as illustrated in FIGS. 1 to 6 may be located outside of the semiconductor package 900 through a surface contact the conductive bump 930 or may be connected to the bias voltage control circuit 810 mounted together with the semiconductor device 920 on the printed circuit board (PCB) 910.

The semiconductor package 900 of FIG. 9 may be used in a semiconductor memory device, a memory controller and/or a portable device. The semiconductor memory device may include a non-volatile memory device, e.g., a flash memory device as well as a DRAM memory device, and the portable device may include a communication device, e.g., a mobile phone, an MP3. player, a video player, an all-in-one of video and audio player, a camera and a game device.

Figure 10:
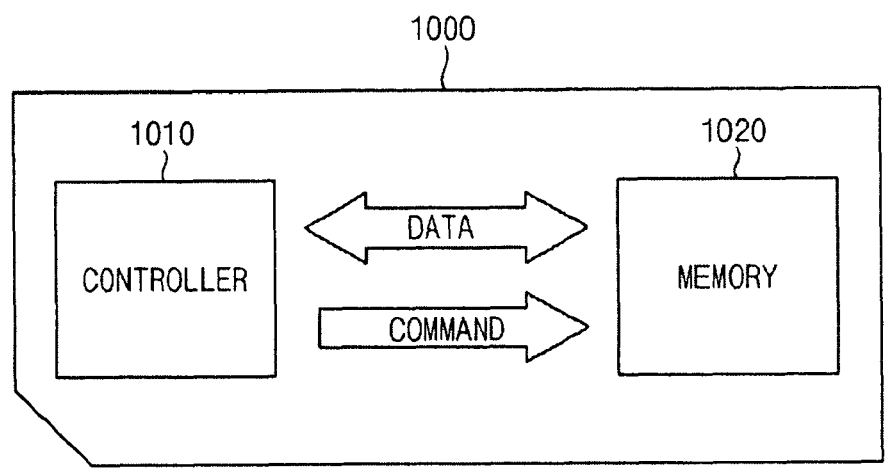
FIG. 10 is a schematic diagram illustrating a memory card 1000 according to example embodiments.

FIG. 10 is a schematic diagram illustrating a memory card 1000 according to example embodiments. Referring to FIG. 10, a controller 1010 and a memory 1020 may exchange electric signals. For example, according to commands of the controller 1010, the memory 1020 and the controller 1010 may exchange data. Accordingly, the memory card 1000 may either store data in the memory 1020 or output data from the memory 1020. The memory 1020 may include one of the semiconductor memory devices described above in reference to FIGS. 1-6 and 9.

Such a memory card 1000 may be used as a storage medium for various portable electronic devices. For example, the memory card 1000 may be a multimedia card (MMC) or a secure digital (SD) card.

Figure 11:
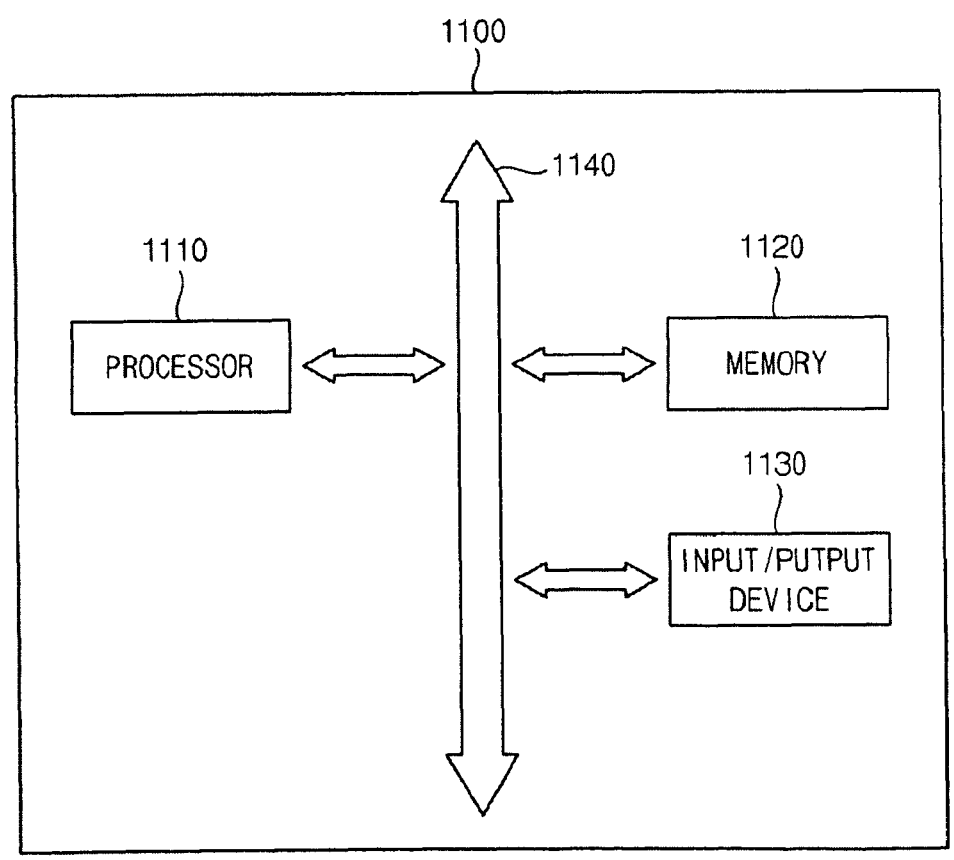
FIG. 11 is a block diagram illustrating an electronic system 1100 according to example embodiments.

FIG. 11 is a block diagram illustrating an electronic system 1100 according to example embodiments. Referring to FIG. 11, a processor 1110, an input/output device 1130, and a memory 1120 may perform data communication with each other by using a bus 1140. The processor 1110 may execute a program and control the electronic system 1100. The input/output device 1130 may be used to input/output data to/from the electronic system 1100. The electronic system 1100 may be connected to an external device, e.g. a personal computer or a network, by using the input/output device 1130 and may exchange data with the external device.

The memory 1120 may store codes or programs for operations of the processor 1110. For example, the memory 1120 may include one of the semiconductor memory devices described above in reference to FIGS. 1-6 and 9.

For example, such an electronic system 1100 may embody various electronic control systems requiring the memory 1120, and, for example, may be used in mobile phones, MP3 players, navigation devices, solid state disks (SSD), or household appliances.

As described above, in a semiconductor device in accordance with example embodiments and a semiconductor package having the semiconductor device, a design margin of wiring may be enhanced and a bias voltage may be provided reliably because one or more bias voltages may be applied through a bias voltage plate formed on a surface of a semiconductor substrate. In addition, in a semiconductor device in accordance with example embodiments and a semiconductor package having the semiconductor device, a bonding process for a three dimensional stack structure may be easily and reliably carried out using a bias voltage plate formed on a surface of a semiconductor substrate. Therefore, example embodiments may be used in an integrated circuit having a semiconductor substrate, a semiconductor device, e.g., a memory device, and a manufacturing process of the devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
    a first substrate including at least one first well region and first impurity regions on portions of the first substrate; and
    a first bias voltage plate on a surface of the first substrate, wherein the first bias voltage plate includes a plurality of segments that are patterned to separate regions of the plurality of segments receiving bias voltages different from each other.

2. The semiconductor device of claim 1, wherein at least one well bias voltage is applied to the at least one first well region through a contact plug connecting a wire on the substrate to a surface of the at least one first well region, and a back bias voltage is applied to the first bias voltage plate.

3. The semiconductor device of claim 1, wherein at least one first well bias voltage is applied to the at least one first well region through a contact plug connecting a wire on the substrate to a surface of the at least first one well region, and at least one second well bias voltage is applied to the plurality of segments of the first bias voltage plate.

4. A semiconductor device comprising:
    a first substrate including at least one first well region and first impurity regions on portions of the first substrate;
    a first bias voltage plate on a surface of the first substrate;
    a second substrate on the first substrate, the second substrate including at least one second well region and second impurity regions on portions of the second substrate; and
    a second bias voltage plate on a surface of the second substrate.

5. The semiconductor device of claim 4, further comprising:
    at least one through contact plug penetrating the first bias voltage plate and the first substrate to contact the second bias voltage plate on the surface of the second substrate.

6. The semiconductor device of claim 4, wherein at least one of the first bias voltage plate and the second bias voltage plate includes a plurality of segments that are patterned to separate regions of the plurality of segments receiving bias voltages different from each other.

7. The semiconductor device of claim 4, wherein the first substrate and the second substrate are stacked such that both a surface of the first substrate and a surface of the second substrate face the same direction, thereby forming a face-to-bottom stack structure.

8. The semiconductor device of claim 7, further comprising:
    at least one through contact plug penetrating the first bias voltage plate and the first substrate to contact the second bias voltage plate on the surface of the second substrate.

9. The semiconductor device of claim 8, wherein at least one well bias voltage is applied to the at least one first well region or to the at least one second well region through a contact plug connecting a wire on the first substrate and the second substrate to a surface of the at least one first well region or to a surface of the at least one second well region, and a back bias voltage is applied to the first bias voltage plate and, simultaneously, to the second bias voltage plate through the at least one through contact plug.

10. The semiconductor device of claim 7, wherein the first bias voltage plate and the second bias voltage plate include a plurality of segments that are patterned to separate regions of the plurality of segments receiving bias voltages different from each other.

11. The semiconductor device of claim 10, further comprising:
    a plurality of through contact plugs penetrating the plurality of segments of the first bias voltage plate and the first substrate to contact the plurality of segments of the second bias voltage plate on the surface of the second substrate.

12. The semiconductor device of claim 11, wherein well bias voltages, different from each other, are applied to the plurality of segments of the first bias voltage plate and, simultaneously, to the plurality of segments of the second bias voltage plate through the plurality of through contact plugs.

13. The semiconductor device of claim 4, wherein the first substrate and the second substrate are stacked such that a surface of the first substrate faces in the opposite direction of a surface of the second substrate, thereby forming a bottom-to-bottom stack structure.

14. The semiconductor device of claim 13, further comprising:
    at least one through contact plug penetrating the first substrate and the first bias voltage plate to contact the second bias voltage plate on the surface of the second substrate.

15. The semiconductor device of claim 14, wherein a back bias voltage is applied to the first bias voltage plate and to the second bias voltage plate, simultaneously, through the at least one through contact plug.

16. The semiconductor device of claim 13, wherein the first bias voltage plate and the second bias voltage plate include a plurality of segments that are patterned to separate regions of the plurality of segments receiving bias voltages different from each other.

17. The semiconductor device of claim 16, further comprising:
    at least one first through contact plug penetrating the first substrate and the plurality of segments of the first bias voltage plate to contact the plurality of segments of the second bias voltage plate on the surface of the second substrate,
    wherein at least one first well bias voltage is applied to the plurality of segments of the first bias voltage plate and to the plurality of segments of the second bias voltage plate, simultaneously, through the at least one first through contact plug.

18. The semiconductor device of claim 17, further comprising:
    at least one second through contact plug penetrating the second substrate and the plurality of segments of the second bias voltage plate to contact the plurality of segments of the first bias voltage plate on the surface of the first substrate,
    wherein at least one second well bias voltage is applied to the plurality of segments of the second bias voltage plate and to the plurality of segments of the first bias voltage plate, simultaneously, through the at least one second through contact plug.

19. A semiconductor package, comprising:
a printed circuit board; and
the semiconductor device of claim 1 on the printed circuit board.

20. A semiconductor package, comprising:
a printed circuit board; and
the semiconductor device of claim 4 on the printed circuit board.

* * * * *